United States Patent [19]
Ohhinata et al.

[11] 3,959,668
[45] May 25, 1976

[54] SEMICONDUCTOR BIDIRECTIONAL SWITCH CIRCUIT

[75] Inventors: Ichiro Ohhinata, Yokohama; Shinzi Okuhara, Fujisawa, both of Japan

[73] Assignee: Hitachi, Ltd., Japan

[22] Filed: Sept. 13, 1974

[21] Appl. No.: 505,973

[30] Foreign Application Priority Data

Sept. 14, 1973  Japan.............................. 48-103039

[52] U.S. Cl........................... 307/252 G; 307/252 T
[51] Int. Cl.² ........................................ H03K 17/72
[58] Field of Search........ 307/252 A, 252 D, 252 G, 307/252 T, 252 N

[56] References Cited
UNITED STATES PATENTS

| | | | |
|---|---|---|---|
| 3,221,183 | 11/1965 | White.............................. | 307/252 T |
| 3,257,566 | 6/1966 | White............................... | 307/252 T |
| 3,303,289 | 2/1967 | Hawley et al. .................. | 307/252 T |

Primary Examiner—John Zazworsky
Attorney, Agent, or Firm—Craig & Antonelli

[57] ABSTRACT

A semiconductor bidirectional switch comprising a couple of thyristor pairs connected in parallel in opposite directions, each of the pairs comprising a cathode gate drive thyristor and an anode-gate drive thyristor, is disclosed, in which the cathode-gates of the cathode-gate drive thyristors are connected to a cathode-gate drive circuit for supplying current and the anode-gates of the anode-gate drive thyristors are connected to an anode-gate drive circuit for taking out current, so that the gate current of the thyristors continues to flow without regard to the amplitude of the signal voltage, thereby permitting the AC signal current to flow therethrough without any momentary cut off even when the AC signal current is reduced below the minimum holding current level of the thyristors.

10 Claims, 7 Drawing Figures

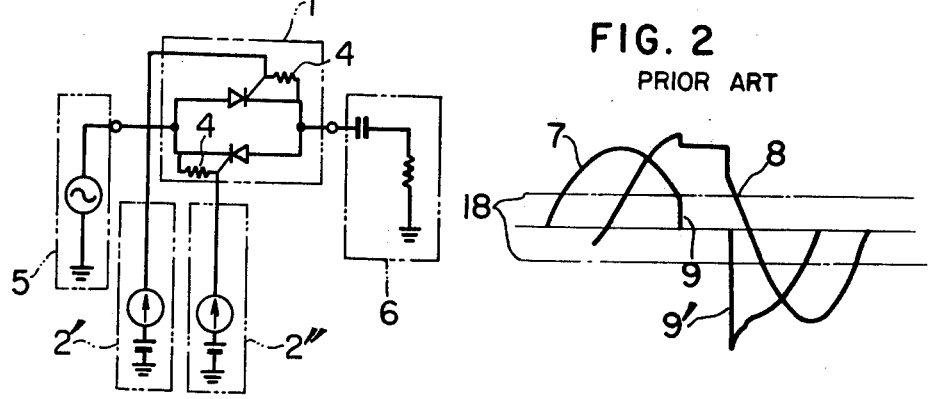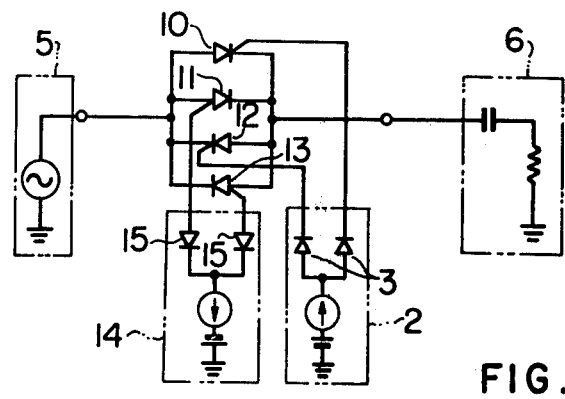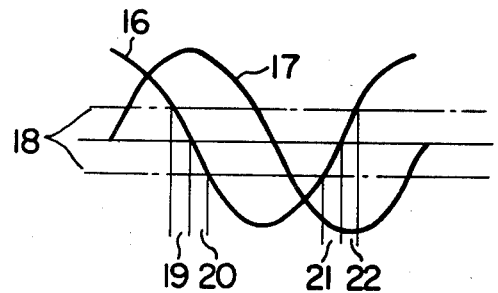

SEMICONDUCTOR BIDIRECTIONAL SWITCH CIRCUIT

The present invention relates to a semiconductor bidirectional switch circuit comprising thyristors for use in the telephone exchange system or the like which is capable of passing an AC signal without interruption.

A conventional bidirectional switch circuit with thyristors for switching an AC signal comprises a couple of thyristors connected in parallel in such a way that a signal current is passed therethrough by applying current to the gates of the thyristors from a drive circuit. This conventional bidirectional switch circuit requires in dependence upon the load condition that the voltage across the drive circuit be larger than the maximum value of the AC signal voltage, in order to pass the AC signal current through the circuit. In other words, in view of the fact that the thyristors are cut off and the current therein is sharply reduced to zero when the current flowing through the thyristors is reduced below their minimum holding current level, the gate current must be made to flow without any interruption if the signal current below the minimum holding current level is to flow continuously. So far as the load consists of a pure resistance, it is easy to make the gate current flow continuously since the voltage is low at a small current value. In the event that the load is inductive or capacitive with a phase difference between load current waveform and load voltage waveform, however, the voltage is at its maximum level at a small current value where the gate current is required to be applied, thus making it necessary to provide a drive circuit having a gate drive voltage higher than the maximum value of the A.C. signal voltage.

An object of the present invention is to provide a semiconductor bidirectional switch circuit in which the A.C. signal voltage is capable of being passed through the thyristors without any momentary cut off even when the AC signal current is reduced below the minimum holding current level of the thyristors in such a manner that a gate current of the thyristors is made to flow continuously with a low drive voltage level without regard to the amplitude of a signal voltage.

According to the present invention, there is provided a semiconductor bidirectional switch circuit comprising a couple of cathode-gate drive thyristors driven by supplying current and a couple of anode-gate drive thyristors driven by taking out current, which are arranged in such a manner that at least one of the gate currents flows as long as the signal voltage is desired to be passed through the thyristors.

The above and other objects and features of the present invention will become apparent when reading the following detailed description of the prior art and the present invention in conjunction with the accompanying drawings, in which:

FIG. 1 is a diagram showing a conventional bidirectional switch circuit comprising a couple of thyristors connected in parallel in opposite directions;

FIG. 2 is a diagram showing waveforms representing load voltage and load current in the circuit of FIG. 1;

FIG. 3 is a diagram showing a semiconductor bidirectional switch circuit according a first embodiment of the present invention;

FIG. 4 shows waveforms of load current and load voltage in the circuit shown in FIG. 3;

Figure 5:
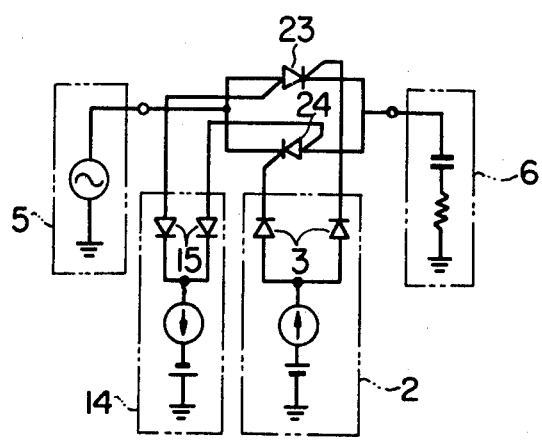
FIG. 5 shows a second embodiment of the invention.

Prior to entering the description of the embodiments of the invention, explanation will be made of the waveforms of the load voltage and load current in the conventional semiconductor switch circuit shown in FIG. 1 and FIG. 2.

Referring to FIG. 1 showing a conventional semiconductor bidirectional switch circuit, reference numeral 1 shows a bidirectional circuit comprising a couple of thyristors connected in parallel in opposite directions so as to pass an AC signal therethrough by supplying current to the gates of the thyristors from a drive circuit 2' or 2'' consisting of a constant current circuit and a power supply.

Numeral 4 shows a couple of resistors each inserted between the cathode and the cathode-gate of the thyristor for the purpose of presenting the thyristors from miss-firing due to the dv/dt effect, even though the drive current and the holding current required for the thyristors increases by the resistors.

As a most fundamental circuit condition, assume that a signal is passing through the bidirectional switch 1 connected with a source 5 and a capacitive load 6, as shown in FIG. 1. It is obvious from the diagram of FIG. 2 that the load current waveform 7 leads the load voltage waveform 8 by substantially $\pi/2$. The gate current is unable to flow when the gate drive voltage is lower than the maximum load voltage, so that the load current is reduced sharply to zero below the minimum-holding current 18 of the thyristors as shown by numeral 9, the load current sharply increasing in the opposite direction when the signal voltage drops to a sufficiently low level to enable the gate current to supply to the thyristors.

In the process, the refiring of the thyristor and the cut-off of the thyristors due to the inability of the load current to reach the minimum-holding current of the thyristors in spite of a successful refiring may alternately occur, depending on the circuit conditions. A method for preventing such an adverse situation which consists in maintaining a gate drive voltage higher than the maximum level of the signal voltage thereby to keep the gate current flow under any conditions is uneconomical and the high DC voltage involved is not preferable in view of the reliability of the circuit component elements.

The present invention obviates the abovementioned disadvantage of the conventional bidirectional switch circuit and provides a semiconductor bidirectional switch circuit in which the gate current of the thyristors is made to flow continuously with a low drive voltage without regard to the amplitude of a signal voltage, so that the signal current is capable of being passed through the thyristors without any momentary cut off even when the AC signal voltage is reduced below the minimum-holding current level of the thyristors.

The diagram of FIG. 3 shows the semiconductor bidirectional switch circuit according to a first embidment of the invention in the state where an AC signal is passing therethrough. Reference numeral 10 shows a cathode-gate drive thyristor, numeral 11 an anode-gate drive thyristor, numeral 12 another cathode-gate drive thyristor connected in the opposite direction to the cathode-gate drive thyristor 10, numeral 13 an anode-gate drive thyristor connected in the opposite direction to the anode-gate drive thyristor 11, numeral 2 a cathode-gate drive circuit comprising a constant current circuit and a power supply, numeral 14 an anode-gate drive circuit comprising a constant current circuit and a power supply, numeral 3 diodes for dividing the gate current to be supplied to the thyristors 10 and 12 and also for blocking the reverse current from the thyristors 10 and 12 to the constant current circuit of the cathode-gate drive circuit 2, numeral 15 diodes for dividing the gate current taken out from the thyristors 11 and 13 and also for blocking the reverse current from the constant current circuit of the anode-gate drive circuit 14 to the thyristors 11 and 13. The signal source 5 and the load circuit 6 consist of most typical ones although they may take various types as in the case of FIG. 1. For the sake of simplicity, the resistors 4 shown inserted between the gates and cathodes in FIG. 1 are not shown in FIG. 4.

Referring to FIG. 4 showing the relationship between the load current waveform and the load voltage waveform associated with the circuit of FIG. 3, the phase of the load current waveform 16 leads that of load voltage waveform 17. With reference to FIG. 3 and FIG. 4, explanation will be made below of the operation of the circuit.

When the load current 16 is reduced below the minimum-holding current level 18 of the thyristors in the circuit of FIG. 4, a momentary cut-off might occur as shown by numeral 9 in FIG. 2 in the absence of the continuous flow of the gate current. The manner in which the above-mentioned problem of the momentary cut-off is overcome by the semiconductor bidirectional switch circuit according to the invention will be explained by dividing the area under problem of signal into regions 19 to 22 to facilitate the understanding of the operation of the invention. First, in the region 19, the fact that the load voltage 17 is almost at its maximum and the anode-gate drive circuit 14 is provided at a negative potential causes the gate current to flow out and the anode-gate drive thyristor 11 to continue closed. In the region 20 where the polarity of the signal current changes and the thyristors connected in the opposite direction must be closed, the load voltage is at its maximum positive value and therefore a gate current flow through the anode-gate drive circuit 14 is necessary to maintain operation with the result that the anode-gate drive thyristor 13 is turned on and continues to be closed to take charge of the region. In the region 21 where the voltage is substantially at its maximum negative level, on the other hand, a gate current can be supplied from the cathode gate drive circuit 2 at a low voltage, so that the cathode-gate drive thyristor 12 is turned on and kept closed thereby to take charge of this region. In the region 22 where the signal current changes its polarity and takes substantially the maximum negative voltage value, a gate current is supplied from the cathode-gate drive circuit 2 and the cahtode gate thyristor 10 is turned on and kept closed thereby to take charge of the region.

In the first embodiment shown in FIG. 3, a gate current can be taken out at a low drive voltage from the anode-gate at a positive load voltage, whereas a gate current can be supplied at a low drive voltage from the cathode-gate at a negative load voltage. Thyristors adapted to be driven by positive and negative drive circuits are connected in parallel, so that the thyristor in which a gate current is capable of flowing in accordance with the load voltage is kept closed, thereby permitting the load current to flow continuously even against a small current below the minimum-holding current of the thyristors.

Further, the circuit arrangement of FIG. 3 in which two pairs of thyristors in opposite directions are connected in parallel through the diodes 3 and 15 respectively, thereby making it possible to reduce the number of the constant current circuits in the gate drive circuit to one half as compared with the conventional device.

Referring to FIG. 5 showing the semiconductor bidirectional switch circuit according to the second embodiment of the invention, the state where an AC signal current is passing is illustrated as in the case of FIG. 3. Reference numeral 23 shows a four-terminal thyristor with a cathode-gate and an anode-gate, and numeral 24 a four-terminal thyristor connected in the opposite direction. Numerals 2 and 14 show gate drive circuits having a circuit arrangement similar to those shown in FIG. 3. By way of explanation, the resistors inserted between the gate and cathode in FIG. 1 are not shown in the circuit of FIG. 5. The operation of this embodiment will be described with reference to FIG. 4. In the region 19, the gate current continues to flow from the anode-gate to the anode-gate drive circuit 14, so that the four-terminal thyristor 23 is kept closed thereby to take charge of this region. In the region 20, the gate current also flows continuously from anode-gate to the anode-gate drive circuit 14, with the result that the four-terminal thyristor 24 is kept closed thereby to take charge of this region. In the region 21, the gate current continues to be supplied from the cathode-gate drive circuit 2 to the cathode-gate, so that the four-terminal thyristor 24 is kept closed to take charge of this region. In the region 22, the gate current continues to flow from the cathode-gate drive circuit 2 to the cathode-gate and as a result the four-terminal thyristor 23 is kept closed to take charge of this region.

As will be seen from the foregoing description, the circuit shown in FIG. 5 is such that, like the circuit of FIG. 3, the signal is capable of flowing continuously even when the load current is reduced below the minimum-holding current of the thyristors.

In the embodiments of FIGS. 3 and 5, the gate drive circuits 2 and 14 do not necessarily take a symmetric form in view of the fact that it suffices if one of them is closed in accordance with the load voltage and that the point of switching the charge need not be at zero potential.

Referring to FIG. 3 showing the third embodiment of the invention, the anode-gate drive circuit 14' has a constant current circuit directly grounded, the other component elements comprising the same ones as those having like reference numerals in FIG. 5. The circuit shown in FIG. 6 operates in such a way that the cathode-gate drive circuit 2 is operated at a slightly positive level of the signal voltage and takes charge of the negative region of the signal voltage, whereas the anode-gate drive circuit 14' takes charge of the positive region of the signal voltage.

Figure 6:
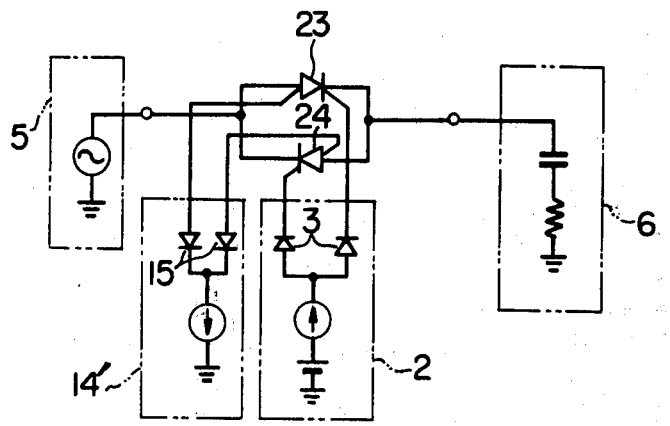
FIG. 6 shows a third embodiment of the invention.

In the third embodiment shown in FIG. 6, the power supply for the gate drive circuit is connected to the side of the cathode-gate drive circuit, but it operates the same way if connected to the side of the anode-gate drive circuit.

Figure 7:
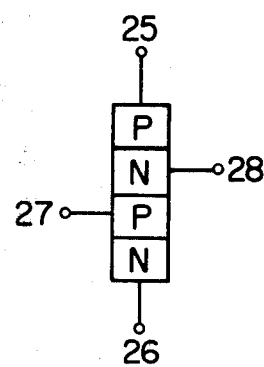
FIG. 7 is a diagram showing a model construction of a four-layer thyristor.

In FIG. 7 showing a model construction of the four-terminal thyristors used in the embodiments of FIG. 5 and FIG. 6, reference numeral 25 shows an anode, numeral 26 a cathode, numeral 27 a cathode-gate, and numeral 28 an anode-gate.

It will be easily understood from the foregoing description of the embodiments that the capacitive load used in the embodiments may be replaced by another type of load such as an inductive load with equal effect since the anode-gate current flow and cathode-gate current flow can be easily effected at positive and negative levels of the signal voltage without regard to the amplitude thereof according to the present invention.

As can be seen from the above description, the presenт inventioon has the great advantage that it is possible that a gate current continues to flow at a low drive voltage without regard to the magnitude of the signal voltage or load voltage even when the load current is reduced below the minimum-holding current of the thyristors, thus making it possible to prevent momentary cut-off of the switch used with whatever load circuit is involved.

What is claimed is:

1. A semiconductor bidirectional switch circuit comprising: a bidirectional switch including a couple of thyristor pairs connected in parallel in opposite directions, each of said pairs including a cathode-gate drive thyristor and an anode-gate drive thyristor; first driving circuit means for supplying current to the cathode-gates of said cathode-gate drive thyristors forming said bidirectional switch; and second driving circuit means for taking out current from the anode-gates of said anode-gate drive thyristors forming said bidirectional switch; wherein under any output loading condition of said thyristors, the amplitude of the output voltage of said first driving circuit means may be made low without regard to the amplitude of an A.C. signal voltage to be switched by said thyristors, so as to allow the signal current flowing through said thyristors to remain flowing even when said A.C. signal voltage is reduced below the minimum holding current level of said thyristors.

2. A semiconductor bidirectional switch circuit according to claim 1, in which at least one of said first and said second driving circuit means have a power supply.

3. A semiconductor bidirectional switch circuit according to claim 1, in which said first driving circuit means includes a constant current circuit, power supply and two diodes, and said cathode-gates of said cathode-gate drive thyristors are connected through said diodes to said constant current circuit.

4. A semiconductor bidirectional switch circuit according to claim 1, in which said second driving circuit means includes a constant current circuit, power supply and two diodes, and the anode-gates of said anode-gate drive thyristors are connected through said diodes to said constant current circuit.

5. A semiconductor bidirectional switch circuit according to claim 3, in which said second driving circuit means includes a constant current circuit, power supply and two diodes, and the anode-gates of said anode-gate drive thyristors are connected through said diodes to said constant current circuit.

6. A semiconductor bidirectional switch circuit comprising: a bidirectional switch including a couple of 4-terminal thyristors each having a cathode-gate and an anode-gate, said 4-terminal thyristors being connected in parallel in opposite directions; first driving circuit means for supplying current to the cathode-gates of said 4-terminal thyristors of said bidirectional switch, and second driving circuit means for taking out current from the anode-gates of said 4-terminal thyristors of said bidirectional switch; wherein under any output loading condition of said thyristors, the amplitude of the output voltage of said first driving circuit means may be made low without regard to the amplitude of an A.C signal voltage to be switched by said thyristors, so as to allow the signal current flowing through said thyristors to remain flowing even when said A.C. signal voltage is reduced below the minimum holding current level of said thyristors.

7. A semiconductor bidirectional switch circuit according to claim 6, in which at least one of said first and second driving circuit means have a power supply.

8. A semiconductor bidirectional switch circuit according to claim 6, in which said first driving circuit means includes a constant current circuit, power supply and two diodes, and the cathode-gates of said 4-terminal thyristors are connected through said diodes to said constant current circuit.

9. A semiconductor bidirectional switch circuit according to claim 6, in which said second driving circuit means includes a constant current circuit, power supply and two diodes, and the anode-gates of said 4-terminal thyristors are connected through said diodes to said constant current circuit.

10. A semiconductor bidirectional switch circuit according to claim 8, in which said second driving circuit means includes a constant current circuit, power supply and two diodes, and the anode-gates of said 4-terminal thyristors are connected through said diodes to said constant current circuit.

* * * * *